(12) United States Patent
McDermott, Sr.

(10) Patent No.: US 7,535,375 B2
(45) Date of Patent: May 19, 2009

(54) LAMP OR LED FAILURE MONITORING SYSTEM

(76) Inventor: Vernon C. McDermott, Sr., 60-41 83rd St., Middle Village, NY (US) 11379

( * ) Notice: Subject to any disclaimer, the term of this patent is extended or adjusted under 35 U.S.C. 154(b) by 0 days.

(21) Appl. No.: 11/781,119

(22) Filed: Jul. 20, 2007

(65) Prior Publication Data

US 2008/0036616 A1 Feb. 14, 2008

Related U.S. Application Data

(60) Provisional application No. 60/832,652, filed on Jul. 21, 2006.

(51) Int. Cl.
*G08B 21/00* (2006.01)
(52) U.S. Cl. .................................... 340/657
(58) Field of Classification Search ................. 340/657
See application file for complete search history.

(56) References Cited

U.S. PATENT DOCUMENTS 3,060,416 A * 10/1962 Brown ........................ 340/509
3,742,295 A * 6/1973 Irie ............................. 315/194
3,917,979 A * 11/1975 Volk, Jr. ....................... 361/50
6,590,757 B2 * 7/2003 Pahl et al. .................. 361/93.2
2005/0012462 A1 * 1/2005 Barry et al. ............... 315/39.53

OTHER PUBLICATIONS

Operability Checking Circuit. Jun. 1976.☐☐IBM Technical Disclosure Bulletin, Jun. 1976, US.☐☐vol. 19, Issue 1, pp. 14-15.*

* cited by examiner

*Primary Examiner*—Daniel Wu
*Assistant Examiner*—John F Mortell
(74) *Attorney, Agent, or Firm*—Locke Lord Bissell & Liddell

(57) ABSTRACT

A light failure monitoring system using existing alarm panels includes a first circuit capable of turning on a solid state switch or transistor, which turns on a lamp or LEDs. The system also includes a second circuit having a light sensitive device, such as a photoresistor, that keeps the solid state switch or transistor turned on upon sensing light from the lamp or LEDs, and when the light sensed by the photoresistor substantially drops in intensity the solid state switch or transistor turns off, which causes an alarm to sound on the alarm panel. Alternatively, the first circuit may include a second solid state switch to amplify the signal and make it easier to start the second circuit.

28 Claims, 5 Drawing Sheets

PRIOR ART

LAMP OR LED FAILURE MONITORING SYSTEM

This application claims the benefit of U.S. Provisional Application No. 60/832,652, filed Jul. 21, 2006, the entire disclosure of which is hereby incorporated by reference.

FIELD OF THE INVENTION

The present invention relates to a system of enabling light-emitting diodes ("LEDs") or low voltage incandescent lamps to be monitored by alarm panels. More specifically, the present invention relates to a system for detecting partial or full loss of light emitted from an LED light source or low voltage incandescent lamp fixtures when attached to alarm panels which detect drops in current caused by lamp failures.

BACKGROUND OF THE INVENTION

Generally, marine running lights on larger vessels and workboats such as Tug boats mostly operate off 120 VAC. Many of these boats have alarm panels that sound an alarm if one of the running lights burns out. As long as the current drain appreciably drops close to zero, then the alarm panel can detect that a light is burned out. In these systems, each light is connected to its own circuit so if current drain drops appreciably almost to zero an alarm indication is displayed. Also, a break in the wiring can drop the current to zero and cause the panel to sound the alarm.

Typically, most of the lights on workboats are operated off 120 VAC, therefore a single lamp runs on one circuit. When a filament of a light burns out, the current immediately drops to zero and an alarm panel can detect the drop in current and sound an alarm for the burned out lamp. An alarm panel may, for example, detect a drop in current directly. Alternatively, an alarm panel may detect a loss of a voltage drop across a resistor, such loss corresponding to a drop in current.

With the implementation of LEDs into these types of circuits, a low voltage supply is required. Also, the LEDs drain much less than incandescent lamps so the alarm panels would indicate lamp failure even though the LEDs were still giving off light. One way of obtaining low voltage is by use of a step down transformer. However, transformers have idle currents, or eddy currents, and therefore there would be a current in the primary winding when no load is connected to the secondary winding of the transformer. Under these conditions, alarm panels will not detect a burned out LED or low voltage incandescent bulb because there is always some primary current. Unfortunately, this primary current is considerable and unless the alarm panels are adjusted precisely, an alarm will not sound. This makes operation of the alarm panels presently in use virtually impossible or impractical with these new types of LEDs or low power incandescent lights.

With reference to FIG. 1, a typical alarm panel circuit 100 with a current sensing relay is illustrated. In FIG. 1, when current I passes through relay coil 110, contacts 120 will remain open. Incandescent lamp 130 is connected to relay coil 110 and contacts 120 through equipotential points 150 and 160. If there is a break in the wiring or incandescent lamp 130 fails, the current drops, which causes contacts 120 to close and alarm 140 to sound. Incandescent lamp 130 may operate on either 120 VAC or 12 VDC. With reference to FIG. 2, a typical alarm panel circuit 200 with a voltage sensing device, such as a comparator, rather than a current sensing device, is illustrated. In FIG. 2, when current flows through electrical circuit 200, incandescent lamp 210 is lit and there is a voltage drop across resistors 220 and 222. Incandescent lamp 210 is connected to the other portions of electrical circuit 200 through equipotential points 260 and 270. Incandescent lamp 210 may operate on 120 VAC or 12 VDC. As long as this voltage appears across resistor 220, comparator 230, which compares the voltage between + and −, keeps transistor 240 on and the circuit to alarm 250 open. If, however, the voltage drop across resistor 220 falls below a predetermined threshold value due to a failure of incandescent lamp 210 or wiring problems, comparator 230 turns transistor 240 off, which closes the circuit causing alarm 250 to sound thereby indicating that incandescent lamp 210 is out.

These and other panel designs do not function properly when attached to LEDs, or low voltage incandescent lamp circuits. Similarly, LEDs and low voltage incandescent lamps cannot be installed in conjunction with presently available alarm panels.

LED lamps generally have the following characteristics: LEDs that are not emitting light can nevertheless drain the same amount of, or more, current than LEDs that are emitting light. Because of this, alarm panels will not sound an alarm even though the LEDs are not emitting any light. Also, LEDs require low voltage to operate and a common way of producing low voltage is a step down transformer. However, transformers have current through their primary winding, which indicates no light failure to the alarm panels even though there may be no load on the secondary winding and the LEDs may not be emitting any light. Under these circumstances, a boat would have no navigation light but the alarm panel would not indicate that a problem exists.

Therefore, it would be desirable if boats equipped with alarm panels could accommodate LEDs such that the LEDs would work on the panels without any modification. It would also be desirable if this system could work on low voltage incandescent types of fixtures.

SUMMARY OF THE INVENTION

The above-identified problems are solved and a technical advance is achieved in the art by a system and method for monitoring for a failure in a lamp or LEDs. The present invention recognizes that by causing the current in an alarm panel circuit to drop substantially, such as to almost zero, whenever there is loss of light from the LEDs or low voltage incandescent lamps, presently available alarm panels will operate properly with LEDs or low-voltage incandescent lamps.

According to one embodiment of the present invention, A light failure monitoring system comprises: a light source; a switch that when turned on allows current to flow through the light source allowing the light source to emit light; a light sensitive device that detects light from the light source; an alarm that goes off when the switch is turned off; wherein the switch is momentarily turned on when voltage is applied to the system, the light sensitive device maintains the switch turned on as long as it detects light from the light source and the light sensitive device turns off the switch when the light sensitive device stops detecting light from the light source.

According to another embodiment of the present invention, A light failure monitoring system comprises: a light source; a transistor that when turned on allows current to flow through the light source allowing the light source to emit light; a circuit that initially turns on the transistor when a voltage is applied to the system; an alarm that goes off when the transistor is turned off; a light sensing device that detects light from the light source; wherein the light sensing device keeps the transistor turned on as long as it detects light from the light source and turns off the transistor when it stops detecting light from the light source.

BRIEF DESCRIPTION OF THE DRAWINGS

The foregoing and other objects and advantages of the present invention will be appreciated more fully from the following detailed description with reference to the accompanying drawings wherein.

DETAILED DESCRIPTION OF THE INVENTION

Figure 1:
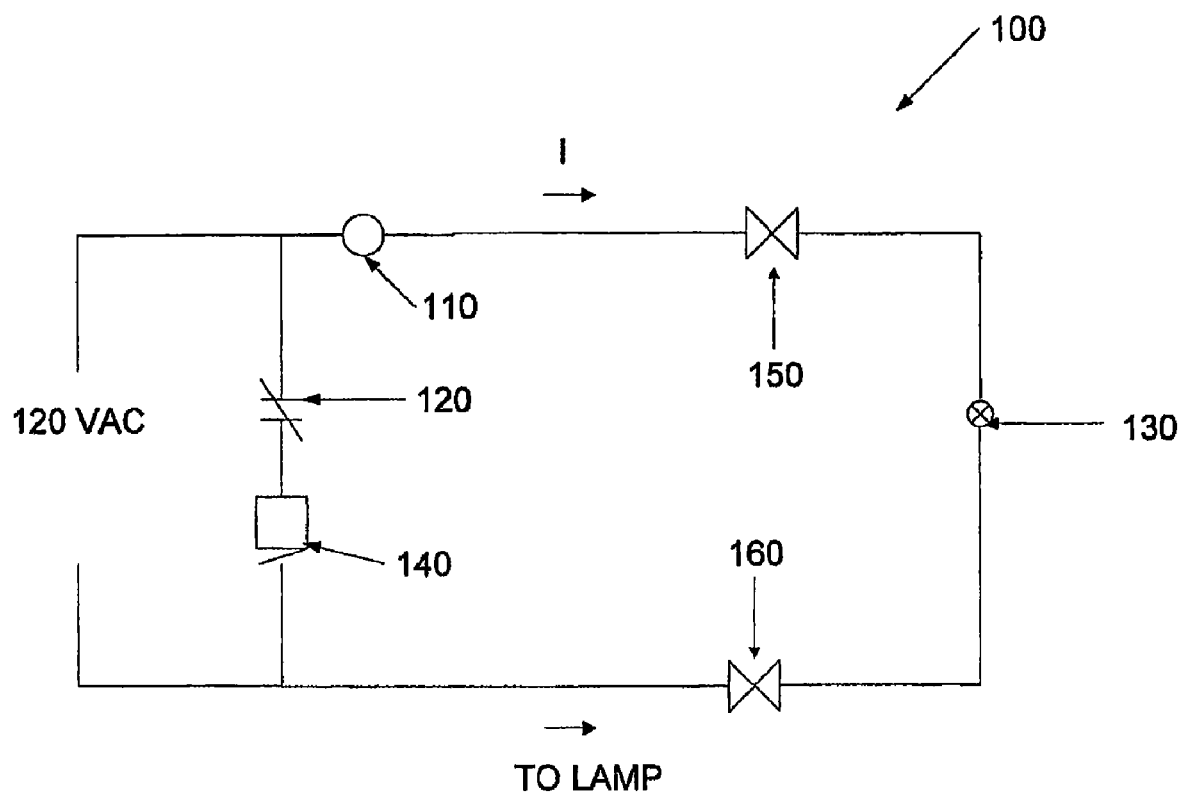
FIG. 1 is a typical alarm panel circuit with a current sensing relay.

The present invention relates to a mechanism for monitoring LEDs or low voltage incandescent lamps using existing alarm panels. With reference to FIG. 3, an exemplary embodiment of an electrical circuit 300 in accordance with the present invention is illustrated. As shown in FIG. 3, electrical circuit 300 comprises, for purposes of illustration, two circuits identified in FIG. 3 as circuit 1 and circuit 2. In FIG. 3, electrical circuit 300 is connected to an alarm panel, such as that shown in FIG. 1 or 2, in lieu of lamp 130 or lamp 210, respectively, and a voltage is thereby applied from the alarm panel. As will be described in detail below, circuit 1 begins at the connections to one of the above-described alarm panels and ends at the primary winding $P_1$ of transformer 380 and circuit 2 begins at the secondary winding $P_2$ of transformer 380 and includes a light sensing device. In FIG. 3, the dashed lines indicate that lamp 310 rather than LEDs 320 may be connected to electrical circuit 300 as shown. Lamp 310 may be any type of lamp known in the art.

Upon connection to a power source, electrical circuit 300 will allow current to momentarily flow to lamp 310 or through resistor 314 to LEDs 320. During that time, lamp 310 or LEDs 320 will emit light. The light from lamp 310 or LEDs 320 will be detected by a light sensing device such as photocell (light sensitive resistance photocell) or photoresistor 330. After this short period of time, it is the photocell or photoresistor 330 that maintains the current flow through the lamp 310 or through resistor 314 and LEDs 320. At some later time when lamp 310 or LEDs 320 burn out, no light from either of those components will be incident upon photocell or photoresistor 330. This will cause the current in electrical circuit 300 to drop to nearly zero, as will be described in detail below, causing the alarm to sound. In that case, circuit 1 will not turn on again unless lamp 310 or LEDs 320 are replaced or power is reapplied from the alarm panel. If power is reapplied from the alarm panel and lamp 310 or LEDs 320 have not been replaced, current will initially flow in electrical circuit 300 but since lamp 310 or LEDs 320 will not be emitting any light, the current in circuit 2 will again drop thus signaling the alarm panel to again sound the alarm.

With further reference to FIG. 3, when voltage is applied to terminals 340 and 350 by virtue of, e.g., a connection to one of the above-described alarm panels, current initially flows through diode 355, into capacitor 360, through resistors 362 and 364 and through diac 365. This current turns on triac or solid state switch (SSSW) 370. Since the current through capacitor 360 will decay with time, SS SW 370 will turn off in a short period of time if not kept on by a second current source. The current in the primary winding $P_1$ of transformer 380 induces a current in the secondary winding $P_2$ of transformer 380, which causes lamp 310 or LEDs 320 to turn on for a short period of time. The light from either of those devices strikes the photoresistor or photocell 330, which upon detecting that light lowers its resistance and supplies the second source of current to SSSW 370. As long as photocell 330 continues to detect light from lamp 310 or LEDs 320, the current through the circuit will continue to flow and therefore the alarm will not sound. If the light emitted from lamp 310 or LEDs 320 is reduced in intensity, photocell 330 will increase its resistance. This increase in resistance will drop the current supplied to SSSW 370 such that SSSW 370 will eventually turn off completely. Once SSSW 370 has been turned off, the current in electrical circuit 300 will drop to nearly zero, at which point the alarm panel will detect a loss of current and sound the light failure alarm.

Figure 4:
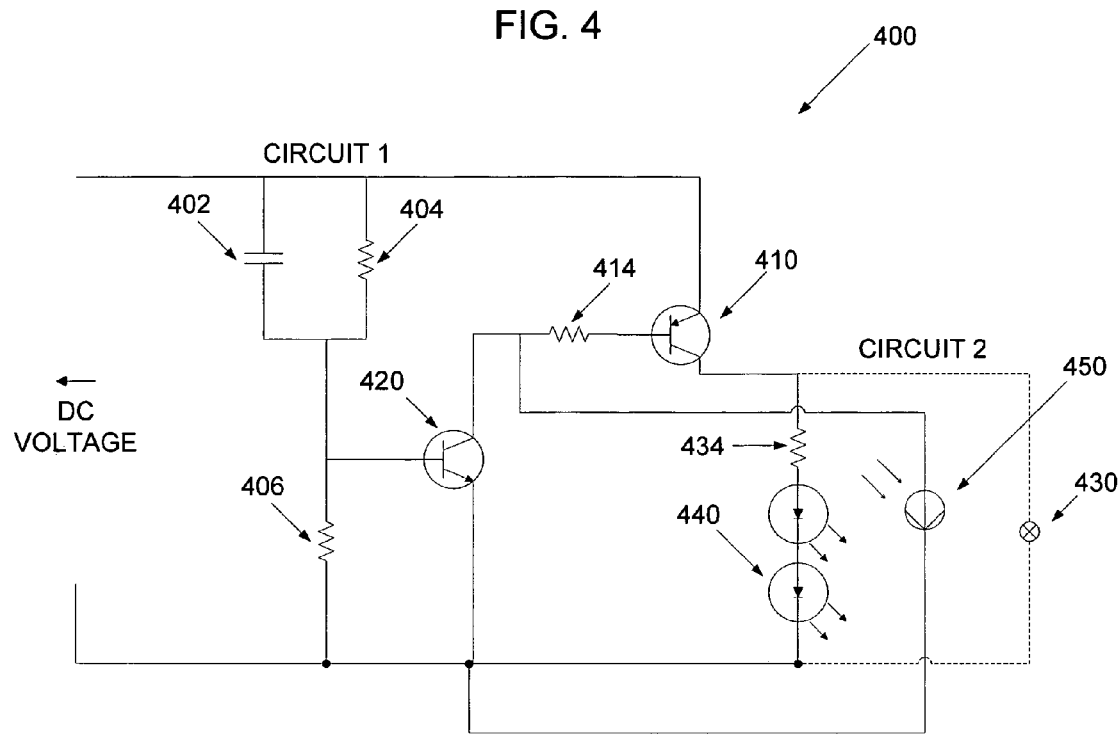
FIG. 4 is a circuit diagram illustrating another exemplary embodiment of the present invention.

Another exemplary embodiment of an electrical circuit 400 in accordance with the present invention is shown in FIG. 4. As shown in FIG. 4, electrical circuit 400 comprises, for purposes of illustration, two circuits identified in FIG. 4 as circuit 1 and circuit 2. In FIG. 4, the power source may be 12, 24 or 32 volts DC. As will be described in detail below, circuit 1 begins at the connections to one of the above-described alarm panels and ends at transistors 410 and 420 and circuit 2 begins at the other side of transistors 410 and 420 and includes a light sensing device. In FIG. 4, the dashed lines again indicate that lamp 430 rather than LEDs 440 may be connected to electrical circuit 400 as shown. Lamp 430 may be any type of lamp known in the art.

Figure 2:
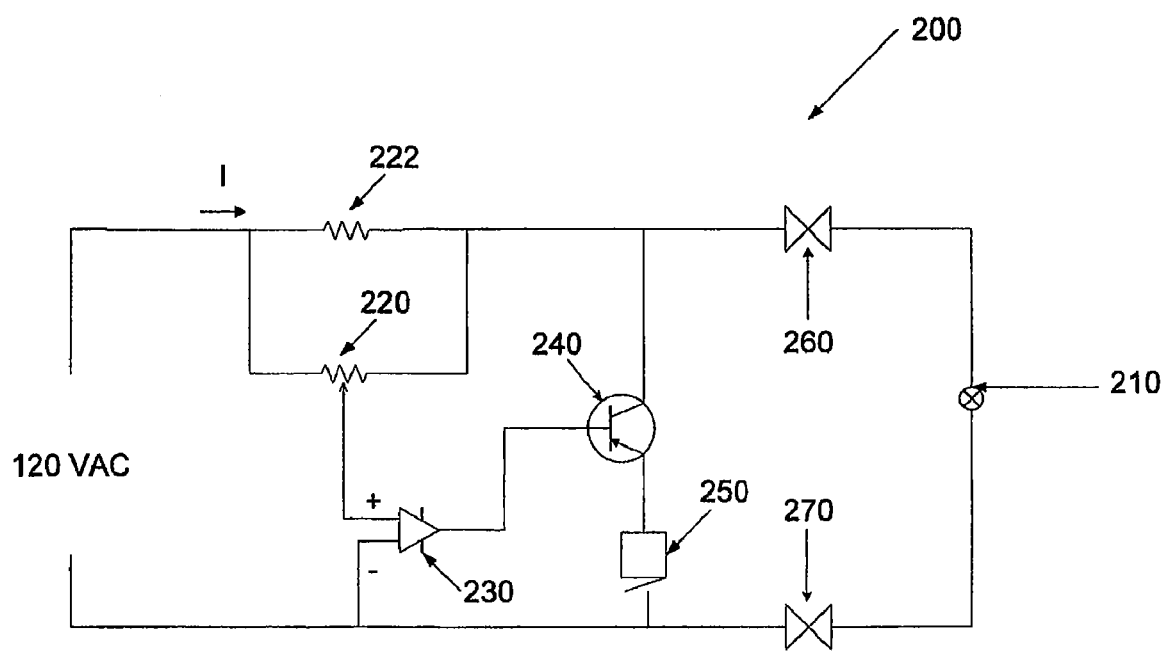
FIG. 2 is another typical alarm panel circuit with an operational voltage sensing device.
Figure 3:
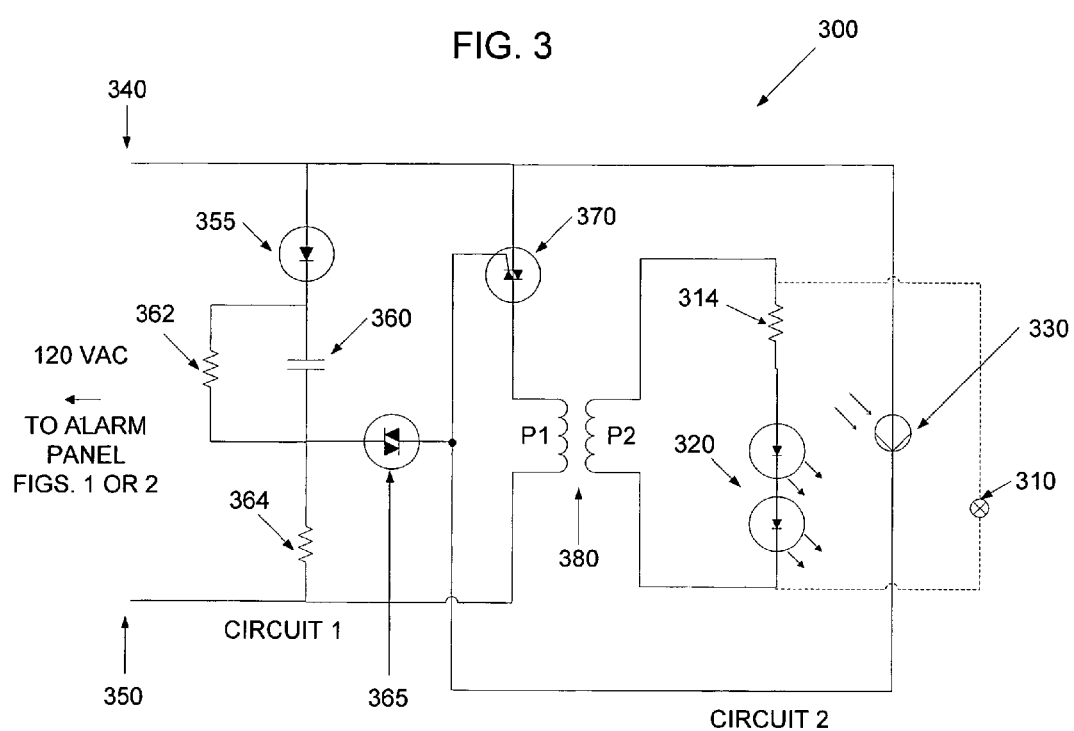
FIG. 3 is a circuit diagram illustrating one exemplary embodiment of the present invention.

An initial flow of current provided by the power source, such as that shown in FIG. 1 or 2, into capacitor 402 and through resistors 404 and 406 of circuit 1 turns on transistors 410 and 420 and allows current to flow through resistor 414 momentarily for an initial period of time. During this time, electrical circuit 400 sends current to lamp 430 or through resistor 434 to LEDs 440. Once lamp 430 or LEDs 440 are turned on, the light emitted by either of those devices, which is detected by photoresistor 450, lowers the resistance of photoresistor 450. This lowered resistance of photoresistor 450 maintains transistors 410 and 420 in an on state even after the aforesaid initial period of time. Thus, a latching circuit is created. As long as lamp 430 or LEDs 440 stays lit, electrical circuit 400 draws current from the alarm panel. As long as there is a drain on the panel from electrical circuit 400, the panel will not sound the alarm. When lamp 430 or LEDs 440 burn out, however, photoresistor 450 increases resistance in circuit 2, causing transistors 410 and 420 to turn off, which disconnects electrical circuit 400 from the panel and causes the panel to sound an alarm.

Figure 5:
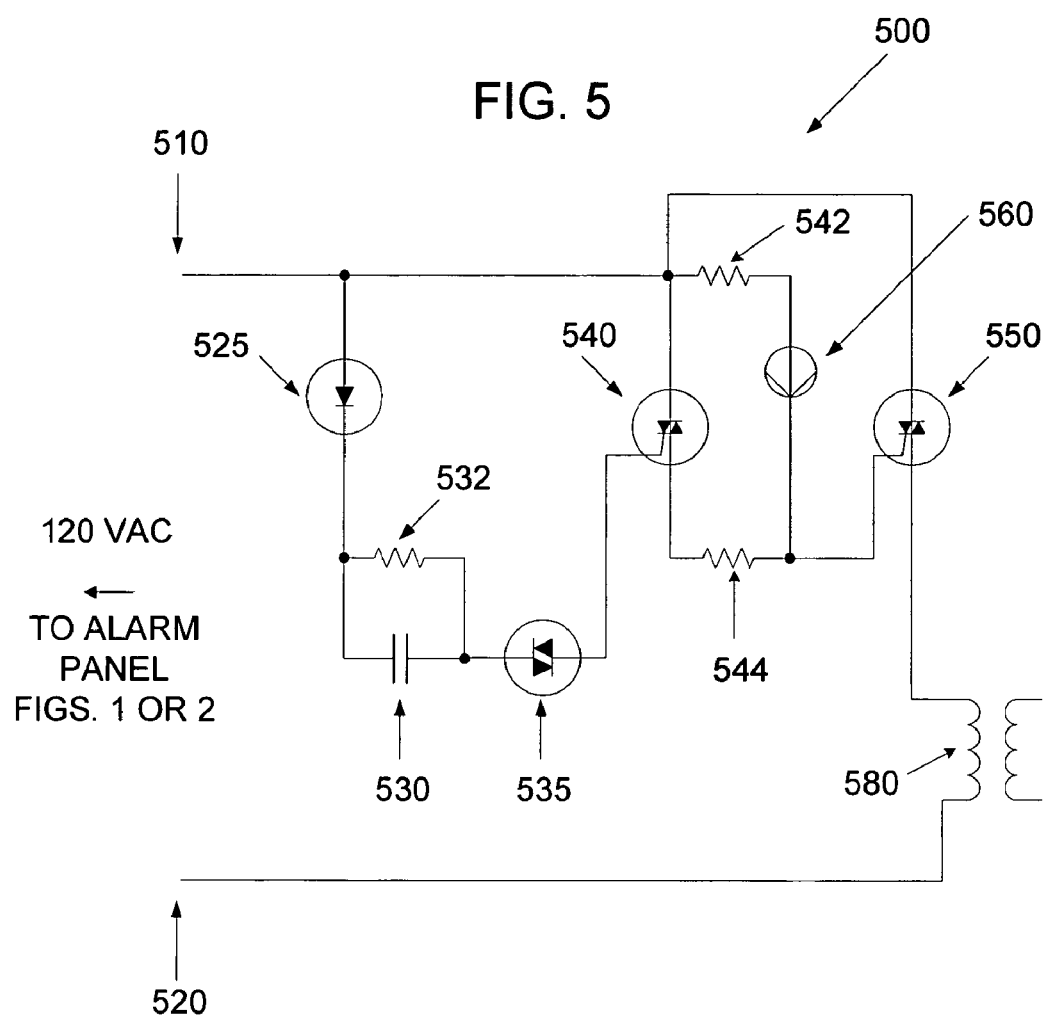
FIG. 5 is a circuit diagram illustrating an alternative embodiment of the present invention to that shown in FIG. 3.

With reference to FIG. 5, an electrical circuit 500 illustrating an alternative to circuit 1 of electrical circuit 300 in FIG. 3 is shown. Referring to FIG. 5, when voltage is applied to terminals 510 and 520, current initially flows through diode 525, into capacitor 530, through resistor 532 and through diac 535. This current flows through resistors 542 and 544 and more importantly turns on the two triacs or solid state switches (SSSWs) 540 and 550, which act as amplifiers thereby making it easier to induce a current through transformer 580 and to turn on a light source (not shown). As with FIG. 3, the light strikes photoresistor or photocell 560 and the current will continue to flow and, as a result, the alarm will not sound. As in FIG. 3, if light emitted from the lamp or LEDs (not shown) should drop in intensity, photocell or photoresistor 560 will increase its resistance, which will cause SSSWs 540 and 550 to turn completely off, at which point, the alarm panel will detect a loss of current and sound a light failure alarm.

The present invention, as described above and shown in the drawings, provides for a lighting failure monitoring system that is versatile, reliable, relatively inexpensive, compact and energy efficient.

It will be apparent to those skilled in the art that various modifications and variations can be made in the device of the present invention without departing from the spirit or scope of the invention.

What is claimed is:

1. A light failure monitoring system, comprising:
    an alarm system in a non-alarm state;
    a first circuit coupled to the alarm system and to a second circuit;
    the first circuit providing a momentary current to activate a switch to an on state; the second circuit responsive to the switch and comprising a light source, said switch, when on, allows a current to flow through the light source allowing the light source to emit light;
    a light sensitive device coupled to the second circuit and detecting light from the light source; said light sensitive device initiates and directs a maintaining current to the switch which replaces the momentary current for continuing the switch in the on state allowing the current to continue the light source transmitting of light from the light source, whereby
    when the light source fails, the maintaining current generated by said light sensitive device decreases and the switch turns off placing the alarm system in an alarm state.

2. The light failure monitoring system according to claim 1, wherein the switch is a solid state switch.

3. The light failure monitoring system according to claim 2, wherein the solid state switch is a triac.

4. The light failure monitoring system according to claim 1, wherein the light sensitive device 1 is a photoresistor.

5. The light failure monitoring system according to claim 1, wherein the light source is a lamp.

6. The light failure monitoring system according to claim 5, wherein the light source is an incandescent lamp.

7. The light failure monitoring system according to claim 1, wherein the light source comprises an LED for a vessel.

8. The light failure monitoring system according to claim 1, wherein the alarm is an alarm panel that applies a voltage to the light failure monitoring system.

9. The light failure monitoring system according to claim 8, wherein the alarm panel applies an AC voltage to the light failure monitoring system.

10. The light failure monitoring system according to claim 8, wherein the alarm panel detects a loss of current in the light failure monitoring system.

11. The light failure monitoring system according to claim 8, further comprising:
    a transformer;
    wherein the transformer steps-down the voltage applied by the alarm panel.

12. The light failure monitoring system according to claim 1, further comprising:
    a diode;
    a capacitor; and
    a diac;
    wherein the diode, the capacitor and the diac operate to initially turn on the switch when voltage is applied to the light failure monitoring system.

13. The light failure monitoring system according to claim 12, wherein the light sensitive device keeps the switch turned on as long as it detects that the light source is emitting light.

14. The light failure monitoring system according to claim 1, further comprising:
    a transformer;
    wherein the transformer induces the current that flows through the light source that causes the light source to emit light.

15. The light failure monitoring system according to claim 14, wherein the transformer is a step-down transformer.

16. The light failure monitoring system according to claim 14, wherein said switch is a first triac and the system further comprises a second triac, the first and second triacs acting as amplifiers.

17. A light failure monitoring system, comprising:
    an alarm system in a non-alarm state;
    a first circuit coupled to the alarm circuit and to a second circuit which comprises a light source;
    a momentary current produced in the first circuit turns on a transistor when a voltage is applied to the first circuit, the transistor, when turned on, allows current to flow through the light source allowing the light source to emit light;
    a light sensitive device which detects light from the light source and monitors the light source wherein the light sensitive sensing device (1) provides a maintaining current replacing the momentary current to keep the transistor turned on and current flowing to the light source as long as the light is detected from the light source and (2) turns off the transistor when the light source fails,
    said turning off of said transistor places the alarm system in an alarm state.

18. A light failure monitoring system according to claim 17, wherein the light source is a lamp.

19. A light failure monitoring system according to claim 17, wherein the light source comprises an LED.

20. A light failure monitoring system according to claim 17, wherein the light sensitive device is a photoresistor.

21. A light failure monitoring system according to claim 17, wherein the light sensitive device is a photo cell.

22. The light failure monitoring system according to claim 17, wherein an alarm panel applies a voltage to the light failure monitoring system.

23. The light failure monitoring system according to claim 22, wherein the alarm panel senses a loss of current in the light failure monitoring system.

24. The light failure monitoring system according to claim 22, wherein the alarm panel applies a DC voltage to the light failure monitoring system.

25. A light failure monitoring system comprising:
    means for emitting light;
    means for allowing current to flow through the system when turned on;
    means for detecting light from the means for emitting light;
    means for alarming that the means for emitting light is not emitting light;
    wherein the means for allowing current to flow is momentarily turned on when a voltage is applied to the system, the means for detecting light provides a maintaining current which keeps the means for allowing current to flow turned on as long as the light is detected from the means for emitting light, whereby the means for detecting light turns off the maintaining current and the means for allowing current to flow when the light is no longer detected from the means for emitting light.

26. The light failure monitoring system according to claim 25, wherein the means for alarming detects a loss of current in the failure monitoring system.

27. The light failure monitoring system according to claim 25, further comprising:

means for initially turning on the means for allowing current to flow when a voltage is applied to the system.

28. A method comprising:

coupling a first circuit to an alarm system in a non-alarm state and to a second circuit;

providing a momentary current in the first circuit to activate a switch to an on state;

activating the second circuit in response to the switch, the second circuit including a light source responsive to the momentary current for transmitting light to a light sensitive device coupled to the second circuit; and monitoring the light source by said light sensitive source for generating and directing a maintaining current replacing the momentary current to the switch which maintains the switch on for continuing the light source transmitting of light from the light source, whereby a failure of the light source decreases the maintaining current which turns off the switch thereby placing the alarm system in an alarm state.

* * * * *